United States Patent
Yoo et al.

(10) Patent No.: US 12,386,106 B2
(45) Date of Patent: Aug. 12, 2025

(54) DISPLAY DEVICE AND MANUFACTURING METHOD OF THE SAME

(71) Applicant: SAMSUNG DISPLAY CO., LTD., Yongin-si (KR)

(72) Inventors: Je Yoon Yoo, Cheonan-si (KR); Dohyung Ryu, Yongin-si (KR); Daehyun Hwang, Seoul (KR); Yongseong Jang, Asan-si (KR); Wu Hyeon Jung, Seoul (KR); Jin Hyun, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 562 days.

(21) Appl. No.: 17/864,510

(22) Filed: Jul. 14, 2022

(65) Prior Publication Data
US 2023/0056002 A1 Feb. 23, 2023

(30) Foreign Application Priority Data
Aug. 20, 2021 (KR) .................. 10-2021-0110136

(51) Int. Cl.
*G02B 5/00* (2006.01)
*G02B 5/30* (2006.01)
*H10K 59/126* (2023.01)
*H10K 71/00* (2023.01)
*H10K 102/00* (2023.01)

(52) U.S. Cl.
CPC ........... *G02B 5/003* (2013.01); *G02B 5/3025* (2013.01); *H10K 59/126* (2023.02); *H10K 71/00* (2023.02); *H10K 2102/311* (2023.02)

(58) Field of Classification Search
CPC .... H10K 59/40; H10K 59/131; H10K 59/873; H10K 59/1201; H10K 59/8791; H10K 59/8792; H10K 71/00; H10K 71/12; H10K 71/851; G02B 5/003; G02B 5/3025;
(Continued)

(56) References Cited

U.S. PATENT DOCUMENTS 9,954,042 B2 4/2018 Lee et al.
10,796,633 B2 10/2020 Ahn et al.
(Continued)

FOREIGN PATENT DOCUMENTS

KR 1020170005215 A 1/2017
KR 1020170115138 A 10/2017
(Continued)

OTHER PUBLICATIONS

Korea Search Report for Korean Patent Application No. 10-2021-0110136, filed on Aug. 20, 2021, 15 pages.

*Primary Examiner* — Sultan Chowdhury
(74) *Attorney, Agent, or Firm* — CANTOR COLBURN LLP

(57) ABSTRACT

A display device includes a display panel including a display area in which a plurality of pixels is disposed and a bending area bent from the display area, a polarizing layer disposed on the display panel and a light-blocking film layer disposed under the display panel, where an entirety of an upper surface of the light-blocking film layer directly contacts a lower surface of the display panel in the display area, and an area of a lower surface of the light-blocking film layer is smaller than an area of the upper surface of the light-blocking film layer.

20 Claims, 13 Drawing Sheets

(58) Field of Classification Search
CPC ........ G06F 3/044; G06F 3/046; G06F 3/0412; G06F 3/0443; G06F 3/0446; G06F 3/04164

See application file for complete search history.

(56) References Cited

U.S. PATENT DOCUMENTS

2017/0005291 A1    1/2017    Sung et al.
2017/0285428 A1    10/2017    Seong et al.
2018/0047938 A1    2/2018    Kishimoto et al.
2020/0161571 A1*    5/2020    Wu ..................... H10K 59/123
2020/0301541 A1*    9/2020    Jeon ..................... G06F 1/1656
2021/0333919 A1*    10/2021    Wu ..................... H10K 59/131

FOREIGN PATENT DOCUMENTS

| KR | 1020180018972 A | 2/2018 |
| KR | 1020190007578 A | 1/2019 |
| KR | 1020190062667 A | 6/2019 |
| KR | 102043177 A | 11/2019 |

\* cited by examiner

VIII

VIII'

DISPLAY DEVICE AND MANUFACTURING METHOD OF THE SAME

This application claims priority to Korean Patent Application No. 10-2021-0110136, filed on Aug. 20, 2021, and all the benefits accruing therefrom under 35 U.S.C. § 119, the content of which in its entirety is herein incorporated by reference.

BACKGROUND

1. Field

Embodiments of the invention relate generally to a display device and manufacturing method of the display device.

2. Description of the Related Art

A display device includes a display panel including a plurality of pixels. The display device displays an image by combining light emitted from each of the plurality of pixels. In this case, a user may recognize the image displayed on a front surface of the display device.

SUMMARY

When external light passes through the display device from a back surface of the display device and is visually recognized by the user, quality of the image displayed on the front surface of the display device may be deteriorated. That is, display quality of the display device may be deteriorated.

Embodiments provide a display device with improved display quality.

Embodiments provide a manufacturing method of the display device.

A display device in an embodiment may include a display panel including a display area in which a plurality of pixels is disposed and a bending area bent from the display area, a polarizing layer disposed on the display panel, and a light-blocking film layer disposed under the display panel, where an entirety of an upper surface of the light-blocking film layer directly contacts an entirety of a lower surface of the display panel in the display area, and an area of a lower surface of the light-blocking film layer is smaller than an area of the upper surface of the light-blocking film layer.

In an embodiment, the light-blocking film layer may include a first adhesive layer directly contacting the lower surface of the display panel in the display area, and a light-blocking material layer disposed under the first adhesive layer.

In an embodiment, an upper surface of the display panel in the display area may directly contact a lower surface of the polarizing layer.

In an embodiment, an area of the lower surface of the polarizing layer may be identical to an area of the upper surface of the display panel in the display area.

In an embodiment, the polarizing layer may include a second adhesive layer directly contacting the upper surface of the display panel, and a polarizing functional layer disposed on the second adhesive layer.

In an embodiment, an area of the lower surface of the display panel may be smaller than an area of an upper surface of the display panel.

In an embodiment, an area of the lower surface of the display panel may be smaller than an area of an upper surface of the display panel.

A manufacturing method of a display device may include forming an align mark in a dummy area of a mother substrate including a display panel area including a first area in which a plurality of pixels is disposed and a second area adjacent to the first area, and the dummy area adjacent to a side of the display panel area, disposing a pre-polarizing layer on the mother substrate to cover an entirety of an upper surface of the mother substrate in the first area, disposing a pre-light-blocking film layer under the mother substrate to cover an entirety of a lower surface of the mother substrate in the first area, cutting the mother substrate, the pre-polarizing layer, and the pre-light-blocking film layer along a cutting line which is a boundary between the display panel area and the dummy area to form a display substrate including the plurality of pixels and a dummy substrate including the align mark, and inspecting a cutting defect by imaging the align mark.

In an embodiment, the dummy substrate may include a dummy light-blocking film layer corresponding to a portion of the pre-light-blocking film layer overlapping the dummy area, a dummy panel corresponding to the dummy area of the mother substrate, including the align mark, and disposed on the dummy light-blocking film layer and a dummy polarizing layer corresponding to a portion of the pre-polarizing layer overlapping the dummy area, and disposed on the dummy panel.

In an embodiment, the align mark may not overlap the dummy light-blocking film layer in a plan view.

In an embodiment, the display substrate may include a light-blocking film layer corresponding to a portion of the pre-light-blocking film layer overlapping the display panel area, a display panel corresponding to the display panel area of the mother substrate, including the plurality of pixels, and disposed on the light-blocking film layer, and a polarizing layer corresponding to a portion of the pre-polarizing layer overlapping the dummy area, and disposed on the display panel.

In an embodiment, the display panel may include a display area corresponding to the first area, in which the plurality of pixels is disposed, and a bending area corresponding to the second area, and bent from the display area.

In an embodiment, an entirety of an upper surface of the light-blocking film layer may directly contact an entirety of a lower surface of the display panel in the display area.

In an embodiment, an area of a lower surface of the light-blocking film layer may be smaller than an area of the upper surface of the light-blocking film layer.

In an embodiment, an upper surface of the display panel may directly contact a lower surface of the polarizing layer in the display area.

In an embodiment, an area of the lower surface of the polarizing layer may be identical to an area of the upper surface of the display panel in the display area.

In an embodiment, an area of the lower surface of the polarizing layer may be smaller than an area of an upper surface of the polarizing layer.

In an embodiment, an area of a lower surface of the display panel may be smaller than an area of an upper surface of the display panel.

In an embodiment, the mother substrate, the pre-polarizing layer, and the pre-light-blocking film layer may be cut by intense light.

In an embodiment, the intense light may be incident on a lower surface of the pre-polarizing layer.

In the display device in embodiments of the invention, since the entirety of the upper surface of the light-blocking film layer directly contacts the entirety of the upper surface of the display panel in the display area, the light-blocking film layer may effectively block external light.

In the manufacturing method in embodiments of the invention, since the pre-light-blocking film layer is disposed under the mother substrate and then cut along the cutting line, a display device in which external light is effectively blocked may be provided.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

DETAILED DESCRIPTION

Figure 1:
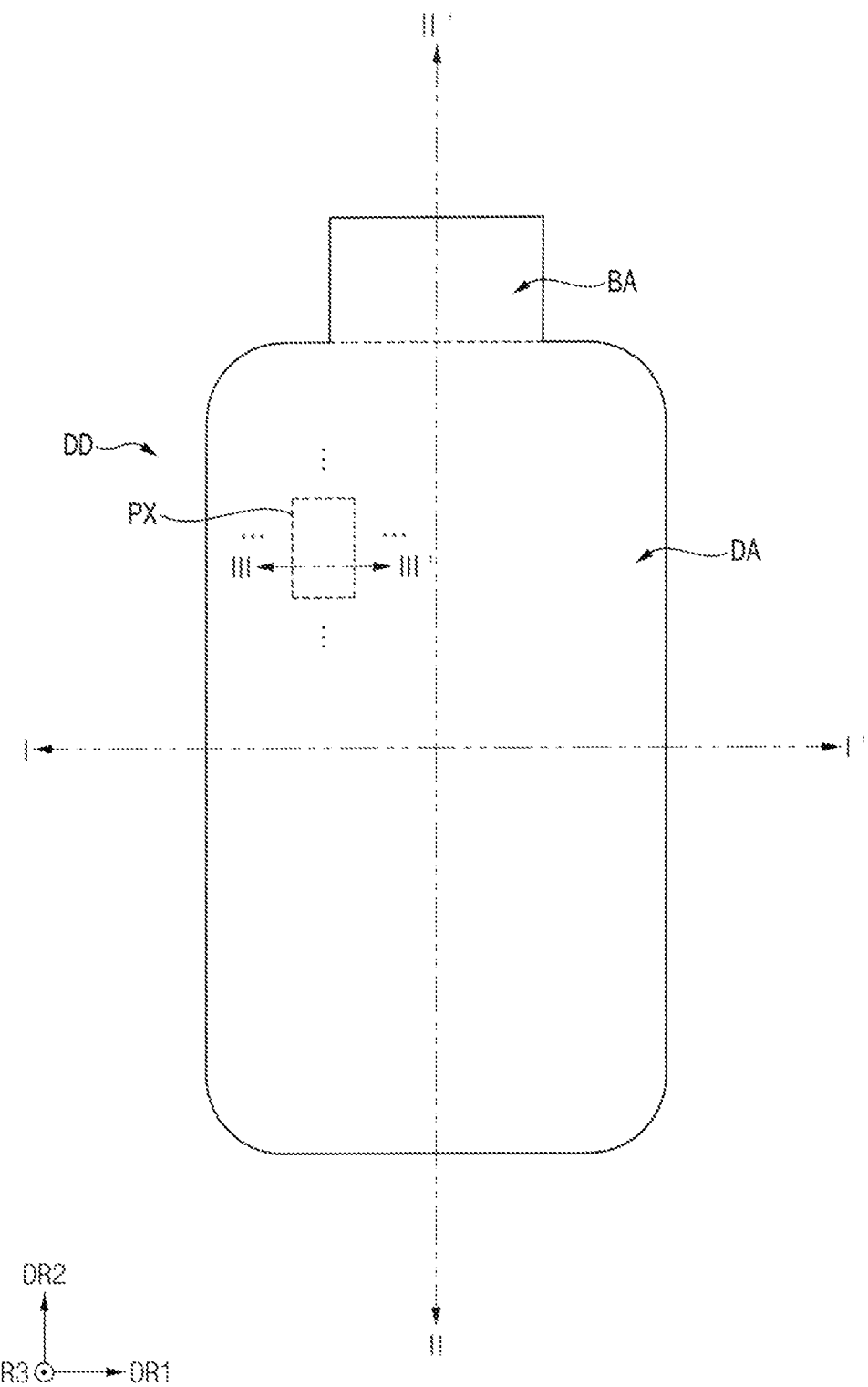
FIG. 1 is a plan view illustrating an embodiment of a display device.

Illustrative, non-limiting embodiments will be more clearly understood from the following detailed description in conjunction with the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
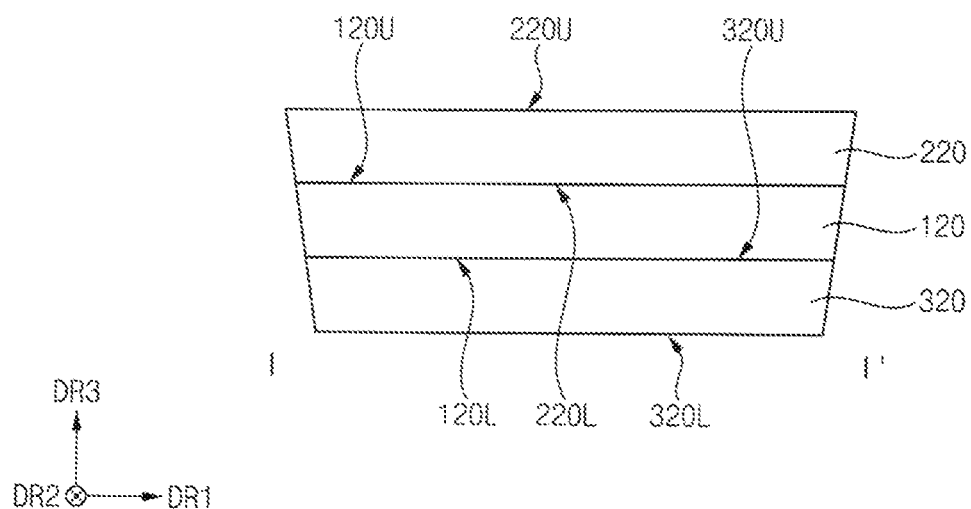
FIG. 2 is a cross-sectional view taken along line I-I' of FIG. 1.
Figure 3:
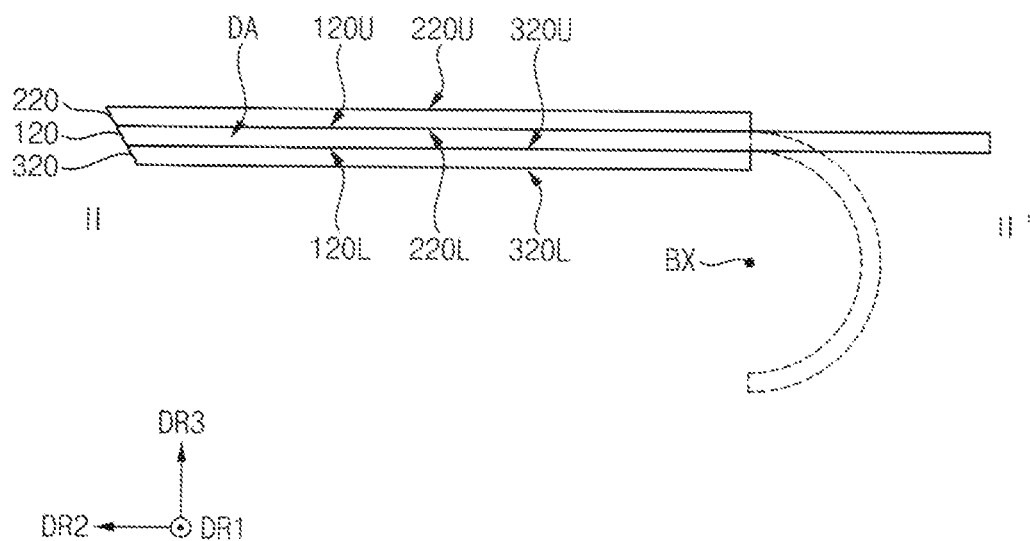
FIG. 3 is a cross-sectional view taken along line II-II' of FIG. 1.

FIG. 1 is a plan view illustrating an embodiment of a display device. FIG. 2 is a cross-sectional view taken along line of FIG. 1. FIG. 3 is a cross-sectional view taken along line II-II' of FIG. 1.

Referring to FIG. 1, FIG. 2, and FIG. 3, a display device in an embodiment may include a display substrate DD. The display substrate DD may include a display panel 120, a polarizing layer 220, and a light-blocking film layer 320.

The display panel 120 may include a display area DA and a bending area BA.

The display panel 120 may include a plurality of pixels PX in the display area DA. The plurality of pixels PX may emit light. The plurality of pixels PX may be arranged in a matrix form. In an embodiment, the plurality of pixels PX may be arranged in a first direction DR1 and a second direction DR2 perpendicular to the first direction DR1, for example.

The bending area BA may be adjacent to the display area DA, and may extend from the display area DA in the second direction DR2. The display panel 120 may be bent in the bending area BA. In an embodiment, in the bending area BA, the display panel 120 may be bent based on a bending axis BX extending in the first direction DR1, for example.

The polarizing layer 220 may be disposed on the display panel 120. An external light may be incident on the display panel 120. In an embodiment, the external light may be incident on an upper surface 120U of the display panel 120, and may be reflected from various electrodes or wires included in the display panel 120, for example. The polarizing layer 220 may prevent the external light from being reflected and recognized by user.

In the display area DA, the upper surface 120U of the display panel 120 may directly contact a lower surface 220L of the polarizing layer 220. In this case, an area of the lower surface 220L of the polarizing layer 220 may be substantially same as an area of the upper surface 120U of the display panel 120. Accordingly, the external light reflected from the display panel 120 may not be recognized by user.

The light-blocking film layer 320 may be disposed under the display panel 120. The light-blocking film layer 320 may include a light-blocking material. Accordingly, an external light incident from a lower surface 120L of the display panel 120 may not be recognized by user.

An upper surface 320U of the light-blocking film layer 320 may directly contact the lower surface 120L of the display panel 120. In this case, an area of the upper surface 320U of the light-blocking film layer 320 may be substantially same as an area of the lower surface 120L of the display panel 120. Accordingly, the external light incident from a lower surface 120L of the display panel 120 may not be recognized by user.

Figure 4:
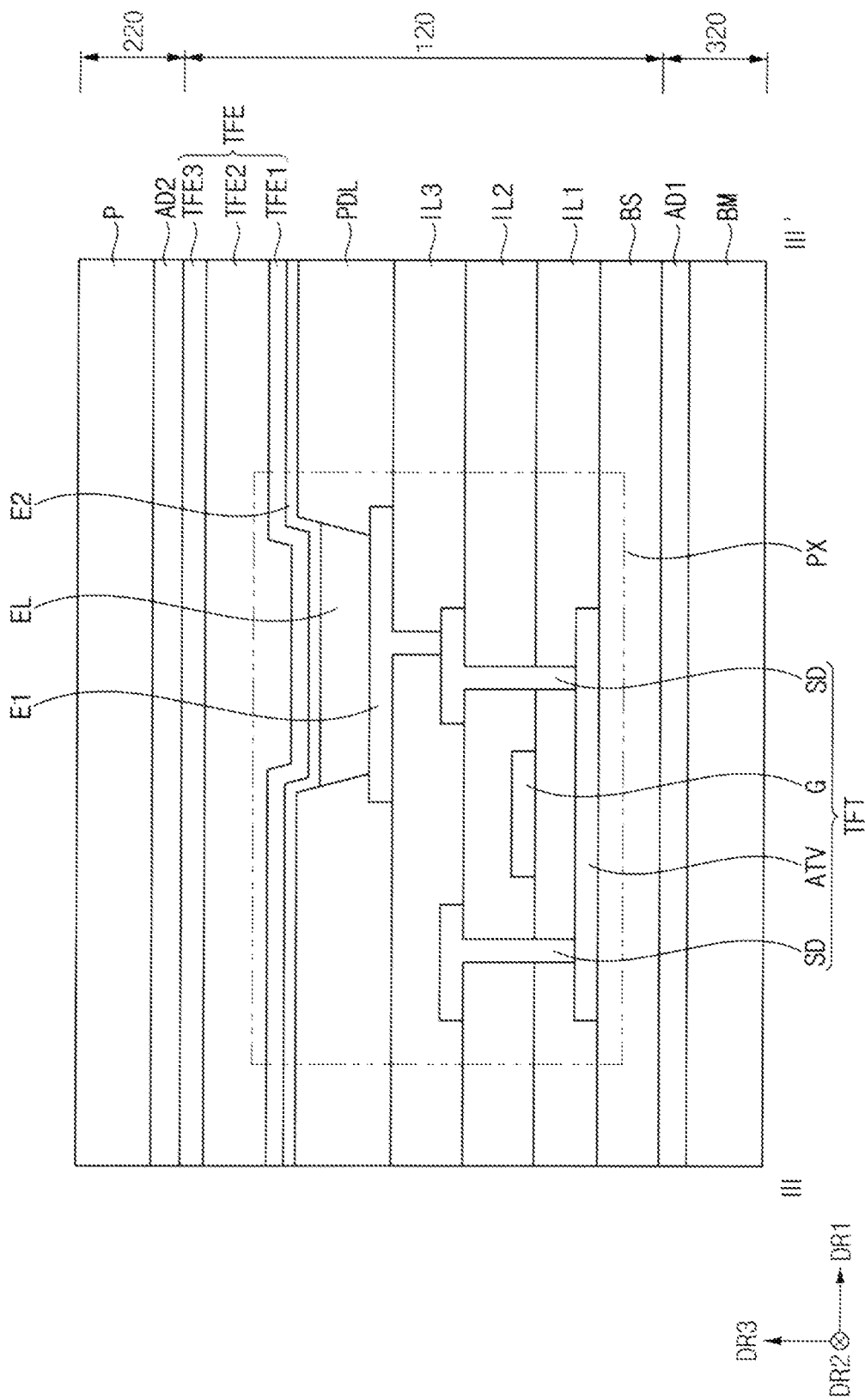
FIG. 4 is a cross-sectional view taken along line III-III' of FIG. 1.

FIG. 4 is a cross-sectional view taken along line of FIG. 1.

Referring to FIG. 4, the display panel 120 may include a base substrate BS, a first insulating layer ILL a second insulating layer IL2, a third insulating layer IL3, a pixel defining layer PDL, an encapsulation layer TFE, a transistor TFT, a first electrode E1, a light-emitting layer EL, and a second electrode E2. The transistor TFT may include a semiconductor layer ATV, a gate electrode G, and a source/drain electrode SD. The encapsulation layer TFE may include a first inorganic encapsulation layer TFE1, an organic encapsulation layer TFE2, and a second inorganic encapsulation layer TFE3. The transistor TFT, the first electrode E1, the light-emitting layer EL, and the second electrode E2 may define a pixel PX.

The base substrate BS may include a glass, a plastic, a polymeric material, etc.

The semiconductor layer ATV may be disposed on the base substrate BS. The semiconductor layer ATV may include a semiconductor material. In an embodiment, the semiconductor layer ATV may include a silicon semiconductor, an oxide semiconductor, etc., for example.

The first insulating layer IL1 may be disposed on the base substrate BS. The first insulating layer IL1 may cover the semiconductor layer ATV. The first insulating layer IL1 may include an inorganic insulating material.

The gate electrode G may be disposed on the first insulating layer ILL The gate electrode G may include a conductive material. The gate electrode G may be electrically insulated from the semiconductor layer ATV by the first insulating layer IL 1.

The second insulating layer IL2 may be disposed on the first insulating layer ILL The second insulating layer IL2 may cover the gate electrode G. The second insulating layer IL2 may include an inorganic insulating material.

The source/drain electrode SD may be disposed on the second insulating layer IL2. The source/drain electrode SD may include a conductive material. The source/drain electrode SD may contact the semiconductor layer ATV. In an embodiment, the source/drain electrode SD may contact the semiconductor layer ATV through a through hole penetrating the first insulating layer IL1 and the second insulating layer IL2 and exposing at least a portion of the semiconductor layer ATV, for example.

The third insulating layer IL3 may be disposed on the second insulating layer IL2. The third insulating layer IL3 may cover the source/drain electrode SD. The third insulating layer IL3 may include an inorganic insulating layer covering the source/drain electrode SD and an organic insulating layer disposed on the inorganic insulating layer and having a substantially flat upper surface.

The first electrode E1 may be disposed on the third insulating layer IL3. The first electrode E1 may include a conductive material. The first electrode E1 may contact the source/drain electrode SD. In an embodiment, the first electrode E1 may contact the source/drain electrode SD through a through hole penetrating the third insulating layer IL3 and exposing at least a portion of the source/drain electrode SD, for example. In an embodiment, the first electrode E1 may be an anode electrode.

The pixel defining layer PDL may be disposed on the third insulating layer IL3. A pixel opening exposing at least a portion of an upper surface of the first electrode E1 may be defined in the pixel defining layer PDL.

The light-emitting layer EL may be disposed on the first electrode E1. The light-emitting layer EL may be disposed in the pixel opening. The light-emitting layer EL may emit light. In an embodiment, the light-emitting layer EL may include an organic light-emitting material.

The second electrode E2 may be disposed on the pixel defining layer PDL. The second electrode E2 may cover the pixel defining layer PDL and the light-emitting layer EL. The second electrode E2 may include a conductive material. In an embodiment, the second electrode E2 may be a cathode electrode.

The first inorganic encapsulation layer TFE1 may be disposed on the second electrode E2. The first inorganic encapsulation layer TFE1 may cover the second electrode E2. The first inorganic encapsulation layer TFE1 may include an inorganic insulating material.

The organic encapsulation layer TFE2 may be disposed on the first inorganic encapsulation layer TFE1. The organic encapsulation layer TFE2 may cover the first inorganic encapsulation layer TFE1. The organic encapsulation layer TFE2 may include an organic insulating material. An upper surface of the organic encapsulation layer TFE2 may be a substantially flat surface.

The second inorganic encapsulation layer TFE3 may be disposed on the organic encapsulation layer TFE2. The second inorganic encapsulation layer TFE3 may cover the organic encapsulation layer TFE2. The second inorganic encapsulation layer TFE3 may include an inorganic insulating material.

The first inorganic encapsulation layer TFE1, the organic encapsulation layer TFE2, and the second inorganic encapsulation layer TFE3 may protect the transistor TFT from moisture, impurities, etc.

Although not shown in FIG. 4, the display panel 120 may further include an optical function layer disposed on the encapsulation layer TFE. The optical function layer may include any structure capable of relatively increasing efficiency of light emitted from the light-emitting layer EL. In an embodiment, the optical function layer may include a first refractive layer disposed on the encapsulation layer TFE and a second refractive layer disposed on the first refractive layer.

Although not shown in FIG. 4, the display panel 120 may further include a sensing layer disposed on the encapsulation layer TFE. The sensing layer may generate an electrical signal by sensing user's touch. In an embodiment, the sensing layer may include a first sensing electrode disposed on the encapsulation layer TFE, a sensing insulating layer disposed on the encapsulation layer TFE and covering the sensing electrode, and a second sensing electrode disposed on the sensing insulating layer and in contact with the first sensing electrode.

The light-blocking film layer 320 may include a first adhesive layer AD1 and the light-blocking material layer BM.

The first adhesive layer AD1 may directly contact the lower surface 120L of the display panel 120 in the display area DA. The first adhesive layer AD1 may include an adhesive material. In an embodiment, the first adhesive layer AD1 may include a pressure sensitive adhesive ("PSA"), for example.

The light-blocking material layer BM may be disposed under the first adhesive layer AD1. The light-blocking material layer BM may include a light-blocking material. The light-blocking material may block light.

The polarizing layer 220 may include a second adhesive layer AD2 and a polarizing functional layer P.

The second adhesive layer AD2 may directly contact the upper surface 120U of the display panel 120 in the display area DA. The second adhesive layer AD2 may include an adhesive material. In an embodiment, the second adhesive layer AD2 may include the PSA, for example.

The polarizing functional layer P may be disposed on the second adhesive layer AD2. The polarizing functional layer P may include a plurality of polarizing axes. In an embodiment, the plurality of polarizing axes may be parallel to each other. In another embodiment, the plurality of polarizing axes may include a plurality of first polarizing axes and a plurality of second polarizing axes orthogonal to the plurality of first polarizing axes.

FIG. 5 to FIG. 15 are diagrams illustrating a manufacturing method of the display device of FIG. 1.

Figure 5:
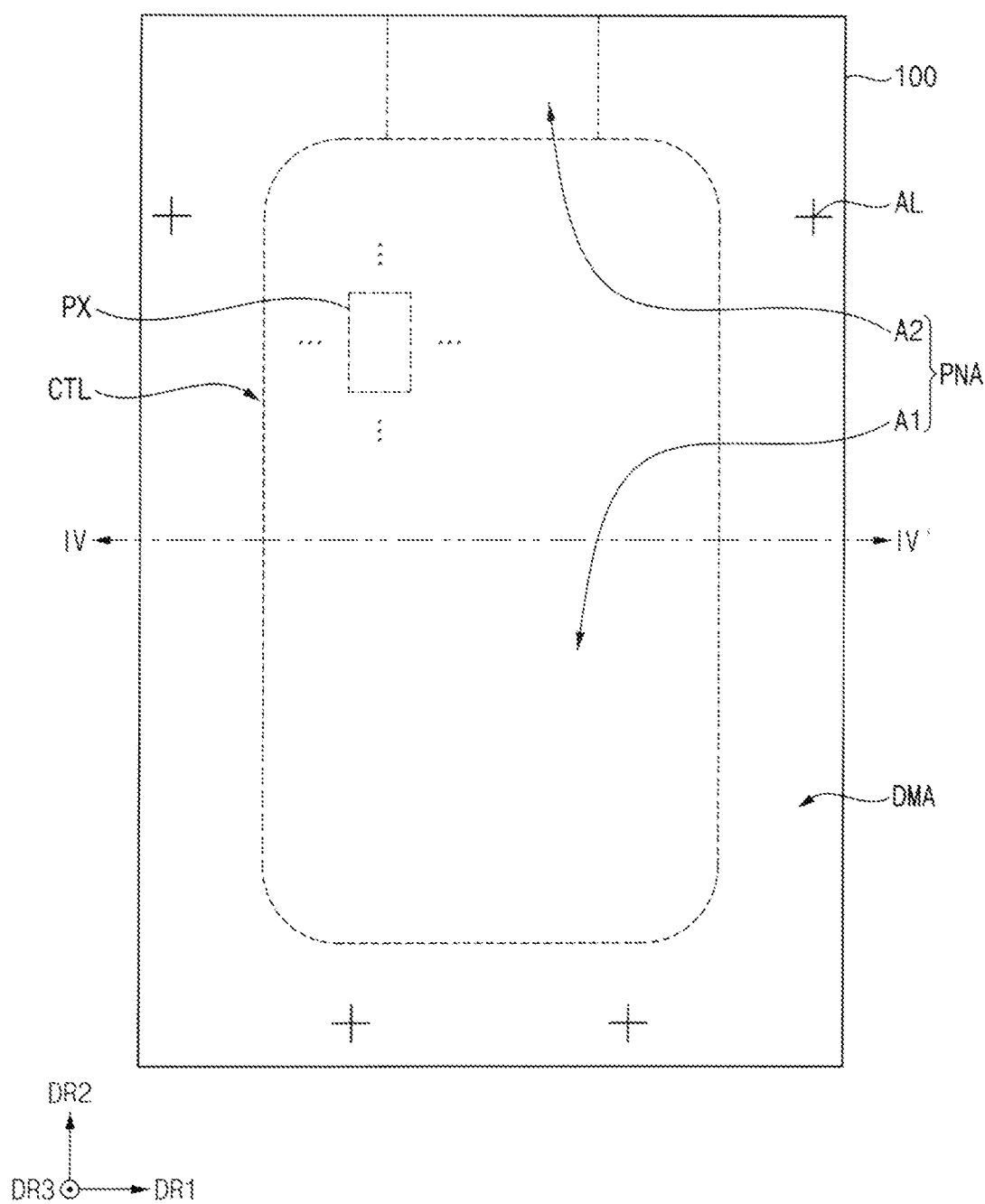
FIG. 5 to FIG. 14 are diagrams illustrating a manufacturing method of the display device of FIG. 1.
Figure 6:
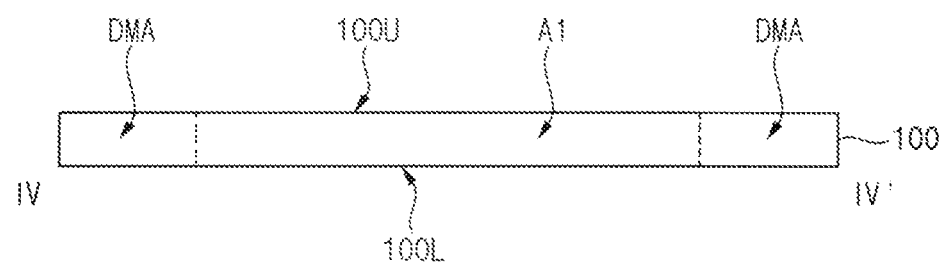
Figure 6:
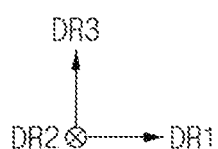

FIG. 5 is a plan view illustrating a mother substrate 100. FIG. 6 is a cross-sectional view taken along line IV-IV' of FIG. 5.

Referring to FIG. 5 and FIG. 6, the mother substrate 100 may include a display panel area PNA and a dummy area DMA.

The display panel area PNA may include a first area A1 and a second area A2 adjacent to the first area A1. A plurality of pixels PX may be disposed in the first area A1. The plurality of pixels PX may be arranged in a predetermined form. In an embodiment, the plurality of pixels PX may be arranged in the first direction DR1 and the second direction DR2, for example. The second area A2 may be extended from the first area A1 in the second direction DR2. The dummy area DMA may be adjacent to at least one side of the display panel area PNA.

An align mark AL may be formed, provided or defined in the dummy area DMA of the mother substrate 100. The align mark AL may be formed or provided on an upper surface of the mother substrate 100 or may be defined in an upper surface of the mother substrate 100. The align mark AL may be a mark for conforming misalignment during a manufacturing process of the display device. The align mark AL may have several different shapes. In an embodiment, the align mark AL may have a cross shape in a plan view. In another embodiment, the align mark AL may have a quadrangular (e.g., rectangular) shape in a plan view.

Figure 7:
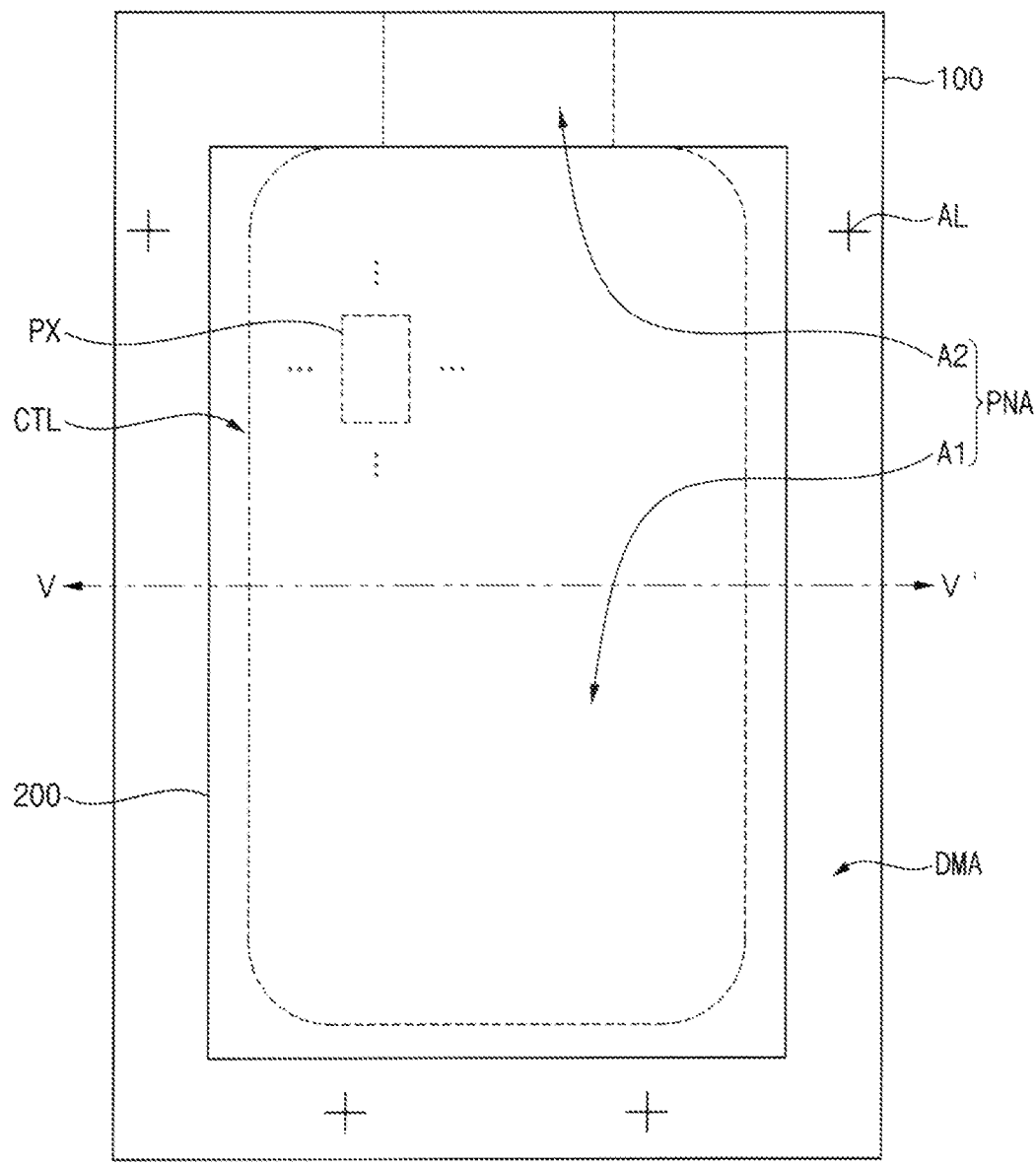
Figure 8:
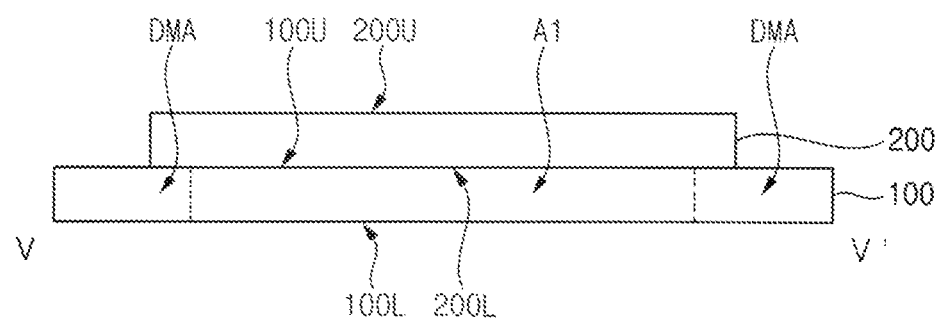
Figure 8:
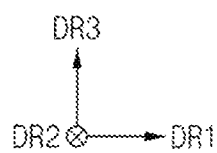

FIG. 7 is a plan view illustrating the mother substrate 100 and a pre-polarizing layer 200. FIG. 8 is a cross-sectional view taken along line V-V' of FIG. 7.

Referring to FIG. 7 and FIG. 8, the pre-polarizing layer 200 may be disposed on the mother substrate 100. A lower surface 200L of the pre-polarizing layer 200 may directly contact an upper surface 100U of the mother substrate 100. The pre-polarizing layer 200 may cover the entirety of the upper surface 100U of the mother substrate 100 in the first area A1.

A planer area of the pre-polarizing layer 200 may be larger than a planer area of the mother substrate 100 in the first area A1. Accordingly, at least a portion of the pre-polarizing layer 200 may overlap the dummy area DMA. In an embodiment, at least a portion of the pre-polarizing layer 200 may overlap the align mark AL. In an embodiment, the pre-polarizing layer 200 may not overlap the second area A2.

Figure 9:
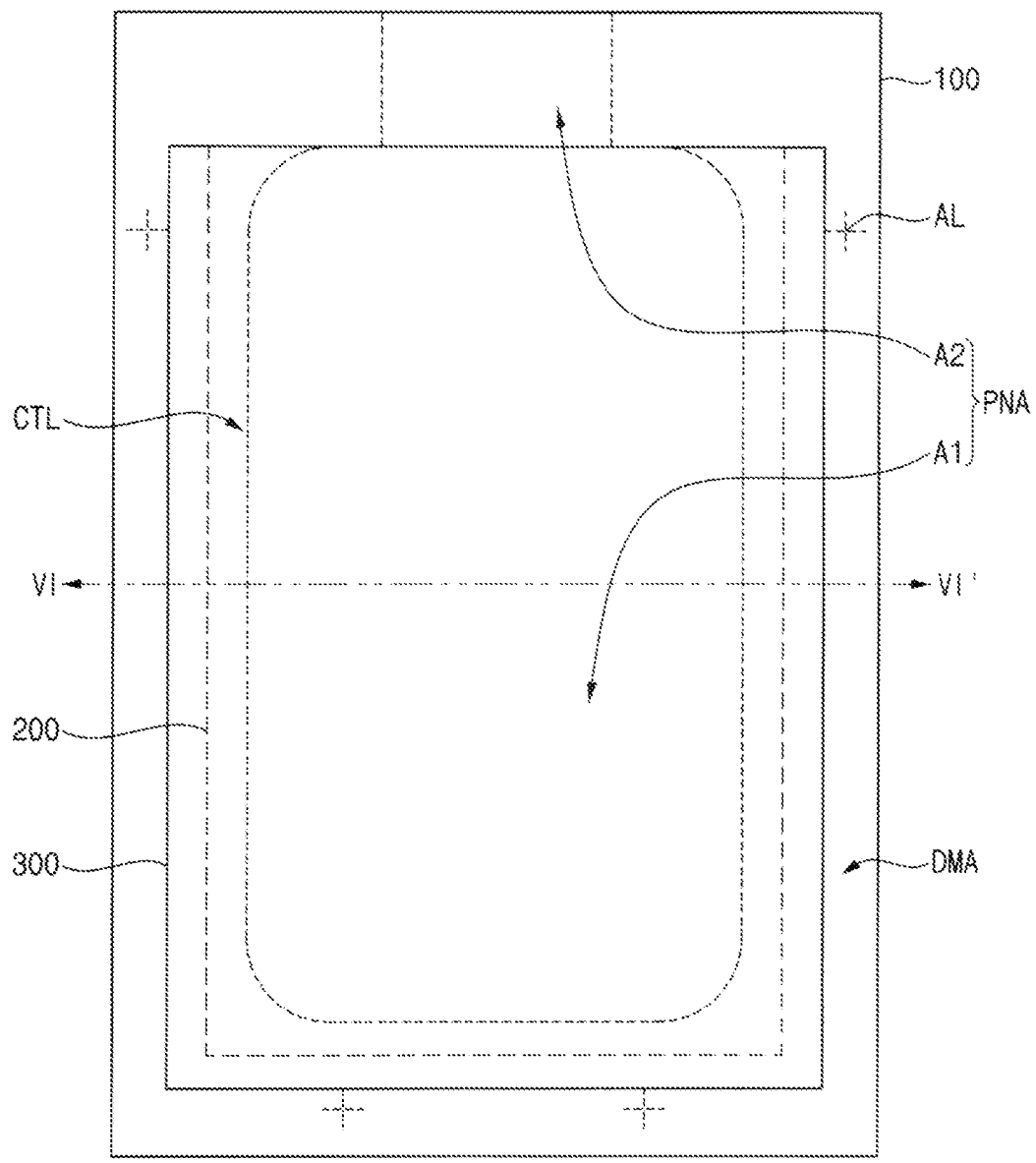
Figure 10:
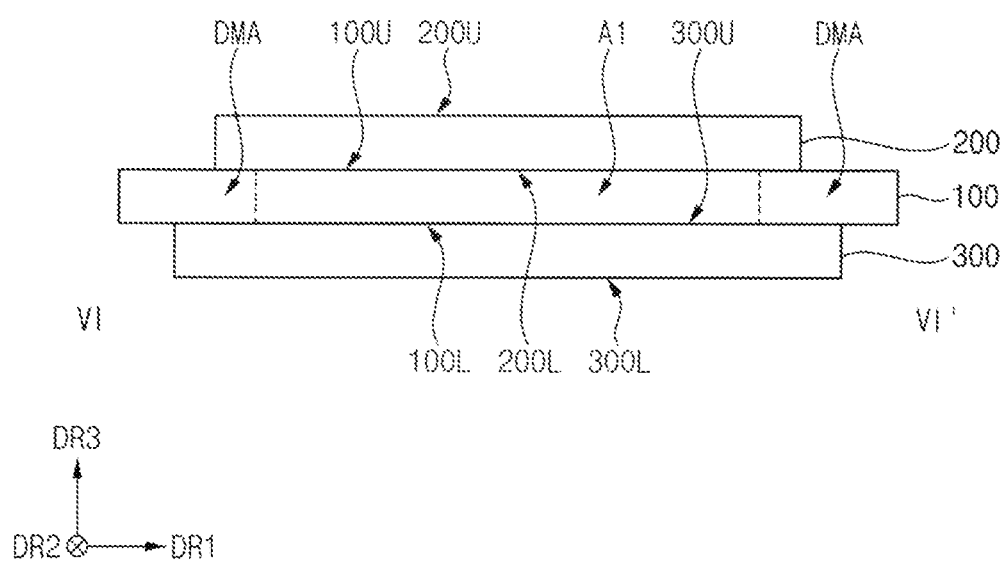

FIG. 9 is a plan view illustrating the mother substrate 100, the pre-polarizing layer 200, and a pre-light-blocking film layer 300. FIG. 10 is a cross-sectional view taken along line VI-VI' of FIG. 9.

Referring to FIG. 9 and FIG. 10, the pre-light-blocking film layer 300 may be disposed under the mother substrate 100. An upper surface 300U of the pre-light-blocking film layer 300 may directly contact a lower surface 100L of the mother substrate 100. The pre-light-blocking film layer 300 may cover the entirety of the lower surface 100L of the mother substrate 100 in the first area A1.

A planer area of the pre-light-blocking film layer 300 may be larger than the planer area of the mother substrate 100 in a first area A1. Accordingly, at least a portion of the pre-light-blocking film layer 300 may overlap the dummy area DMA. In this case, the pre-light-blocking film layer 300 may not overlap the align mark AL. In an embodiment, the pre-light-blocking film layer 300 may not overlap the second area A2.

The pre-light-blocking film layer 300 may include a light-blocking material. Accordingly, the pre-light-blocking film layer 300 may block light.

Figure 11:
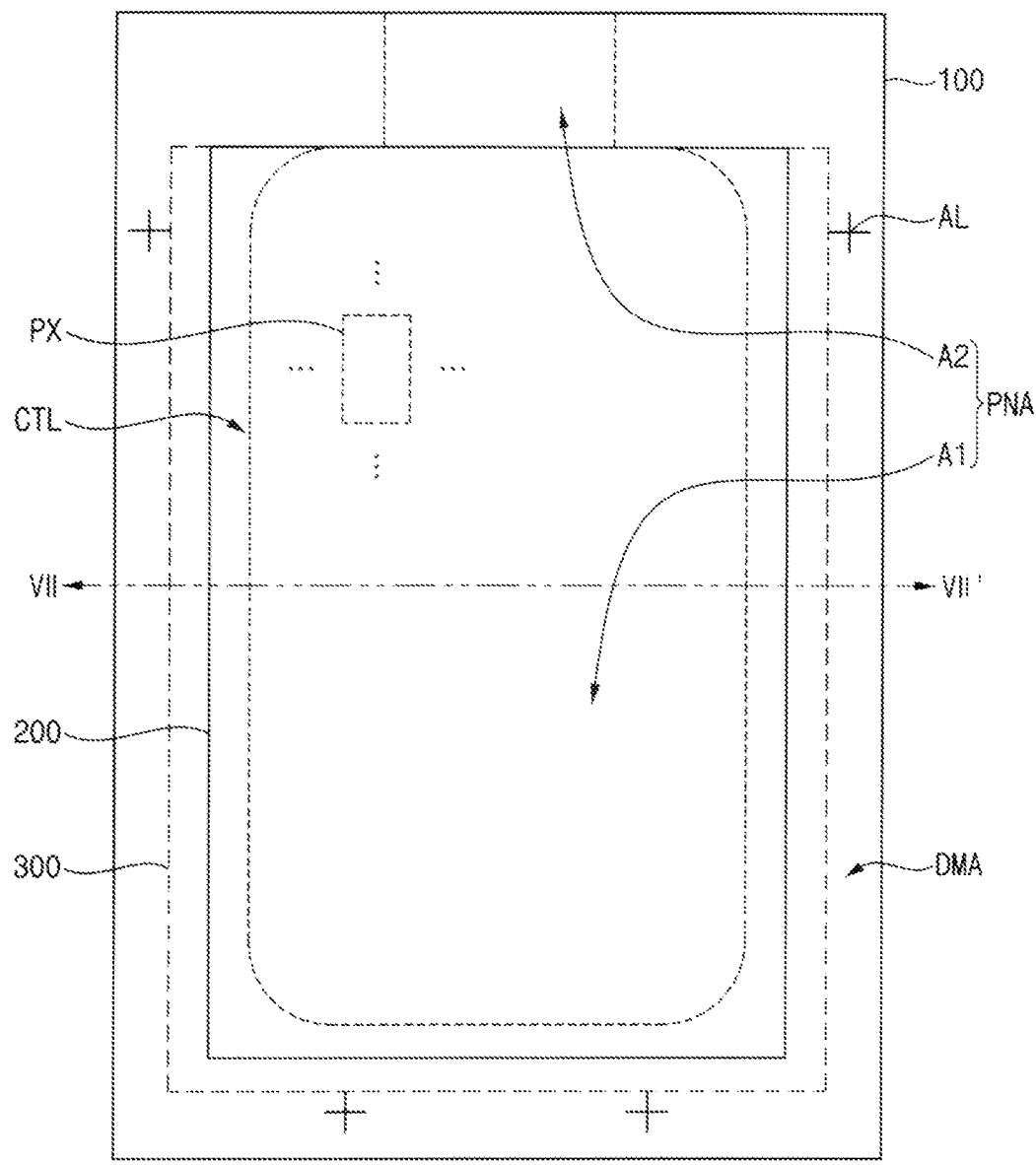
Figure 12:
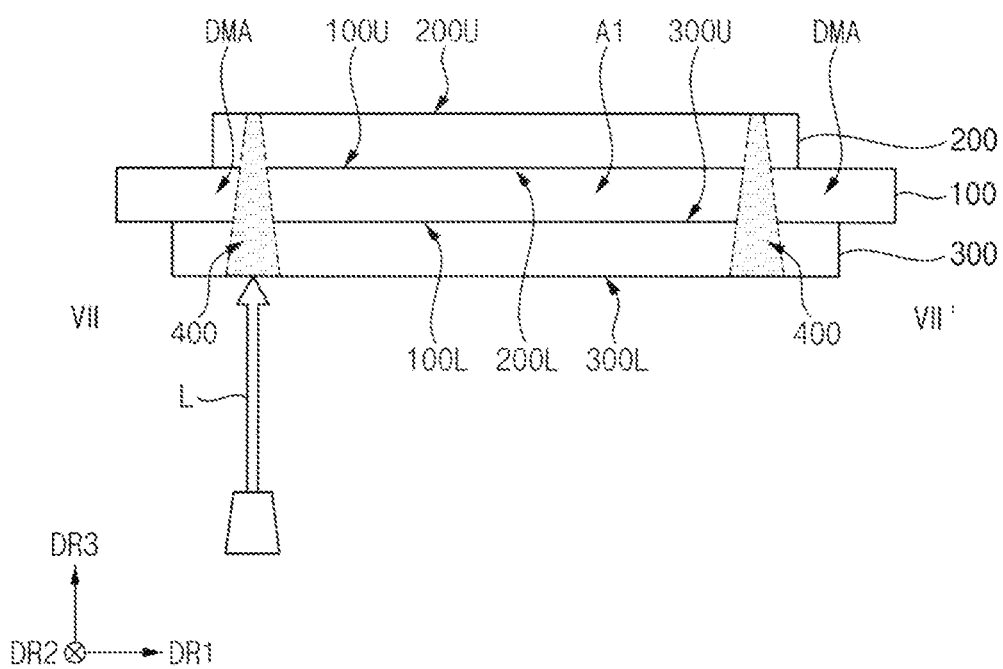

FIG. 11 and FIG. 12 are diagrams illustrating cutting the mother substrate 100, the pre-polarizing layer 200, and the pre-light-blocking film layer 300 of FIG. 9. FIG. 11 is a plan view illustrating the mother substrate 100, the pre-polarizing layer 200, and the pre-light-blocking film layer 300. FIG. 12 is a cross-sectional view taken along line VII-VII' of FIG. 11.

Referring to FIG. 11 and FIG. 12, the mother substrate 100, the pre-polarizing layer 200, and the pre-light-blocking film layer 300 may be cut along a cutting line CTL defined by a boundary between the display panel area PNA and the dummy area DMA.

The mother substrate 100, the pre-polarizing layer 200, and the pre-light-blocking film layer 300 may be cut using known cutting methods. In an embodiment, the mother substrate 100, the pre-polarizing layer 200, and the pre-light-blocking film layer 300 may be irradiated by intense light (e.g., laser L) along the cutting lien CTL. In this case, when the laser L is incident on an upper surface 200U of the pre-polarizing layer 200, the pre-polarizing layer 200 may be damaged by the laser L. Accordingly, in order to prevent damage to the pre-polarizing layer 200, the laser L may incident to a lower surface 300L of the pre-light-blocking film layer 300.

As the mother substrate 100, the pre-polarizing layer 200, and the pre-light-blocking film layer 300 are cut, a portion of each of the mother substrate 100, the pre-polarizing layer 200, and the pre-light-blocking film layer 300 may be lost. The portion may be referred to as a lost portion 400. A width of the lost portion 400 along a main plane extension direction (e.g., horizontal direction in FIG. 12) defined by the first and the second directions DR1 and DR2 may decrease in a third direction DR3 which is a direction from the lower surface 300L of the pre-light-blocking film layer 300 to the upper surface 200U of the pre-polarizing layer 200. In an embodiment, the lost portion 400 may have a trapezoidal shape in which a length of an upper side is smaller than a length of the lower side in the main plane extension direction (e.g., horizontal direction in FIG. 12) as shown in FIG. 12.

The lost portion 400 may be removed, and accordingly, the display substrate DD described with reference to FIG. 1, FIG. 2, FIG. 3, and FIG. 4 and a dummy substrate DMS to be described later with reference to FIG. 13 and FIG. 14 may be formed or provided.

Referring to FIG. 1, FIG. 2, FIG. 3 and FIG. 4, in the display substrate DD, the display panel 120 may correspond to the display panel area PNA of the mother substrate 100, and the polarizing layer 220 may correspond to a portion of the pre-polarizing layer 200 overlapping the display panel area PNA, and the light-blocking film layer 320 may correspond to a portion of the pre-light-blocking film layer 300 overlapping the display panel area PNA. In addition, in the display substrate DD, the display area DA of the display panel 120 may correspond to the first area A1 of the mother substrate 100, and the bending area BA of the display panel 120 may correspond to the second area A2 of the mother substrate 100.

Since the width of the lost portion 400 decreases in the third direction DR3, in the mother substrate 100, the area of the lower surface 120L of the display panel 120 may be smaller than the area of the upper surface 120U of the display panel 120, an area of the lower surface 220L of the polarizing layer 220 may be smaller than an area of an upper surface 220U of the polarizing layer 220, and an area of a lower surface 320L of the light-blocking film layer 320 may be smaller than the area of the upper surface 320U of the light-blocking film layer 320.

Figure 13:
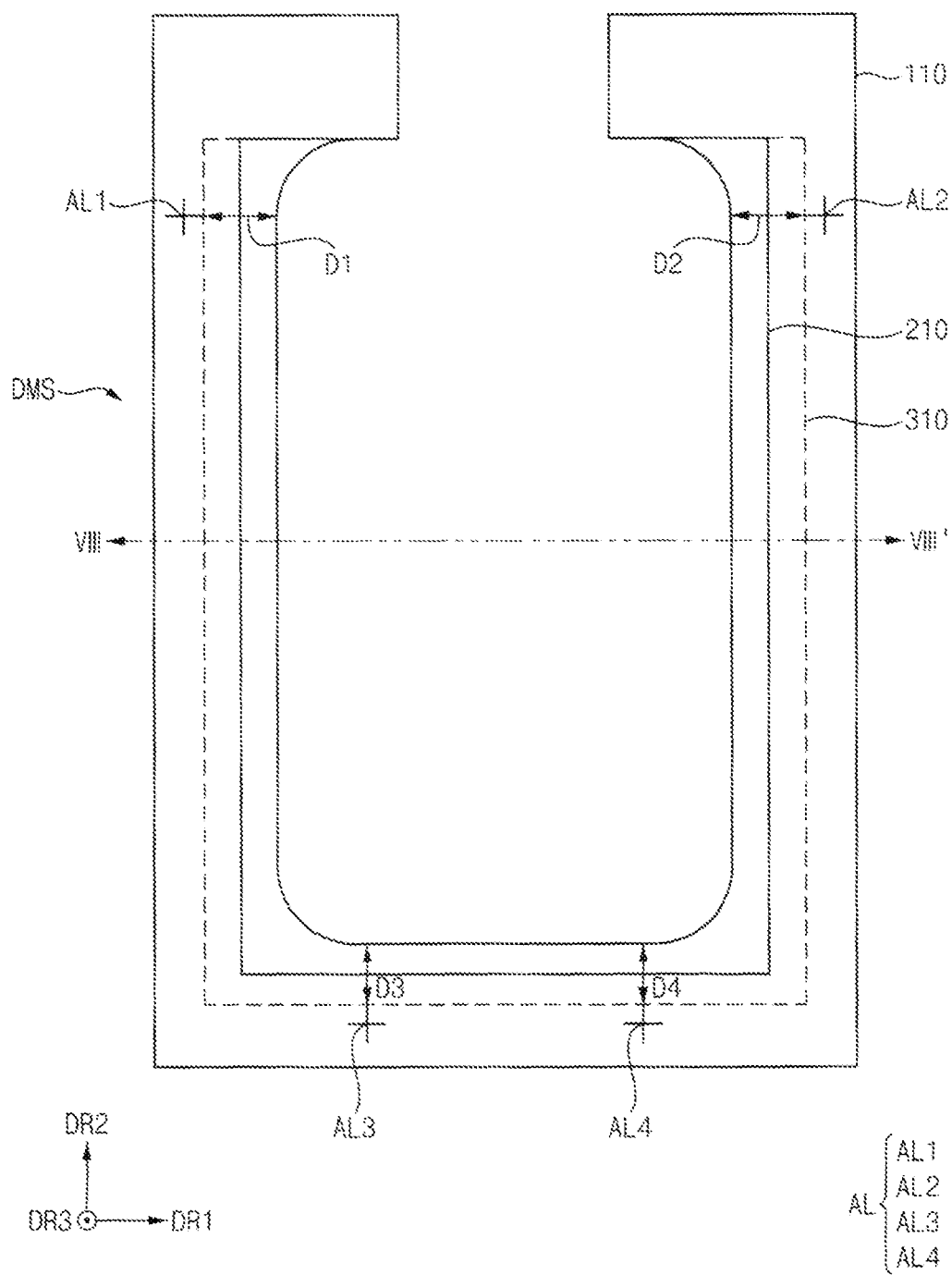

FIG. 13 is a plan view illustrating the dummy substrate DMS. FIG. 14 is a cross-sectional view taken along line in FIG. 13.

Figure 14:
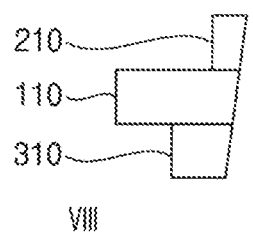
Figure 14:
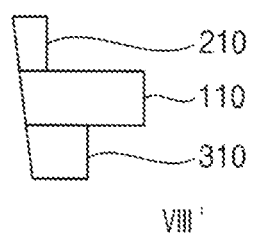
Figure 14:
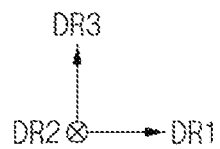

Referring to FIG. 13 and FIG. 14, the dummy substrate DMS may include a dummy panel 110, a dummy polarizing layer 210, and a dummy light-blocking film layer 310.

The dummy panel 110 may correspond to the dummy area DMA (refer to FIGS. 7 to 12) of the mother substrate 100. Accordingly, the dummy panel 110 may include the align mark AL.

The dummy polarizing layer 210 may correspond to a portion of the pre-polarizing layer 200 overlapping the dummy area DMA. The dummy polarizing layer 210 may be disposed on the dummy panel 110.

The dummy light-blocking film layer 310 may correspond to a portion of the pre-light-blocking film layer 300 (refer to FIGS. 9 to 12) overlapping the dummy area DMA. The dummy light-blocking film layer 310 may be disposed under the dummy panel 110.

A cutting defect may be inspected by imaging the align mark AL of the dummy substrate DMS. In an embodiment, by measuring a distance between the align mark AL and an outer edge of the dummy substrate DMS, the cutting defect may be inspected, for example.

More specifically, in an embodiment, the align mark AL may include a first align mark AL1, a second align mark AL2, a third align mark AL3, and a fourth align mark AL4.

In this case, a first distance D1 from the first align mark AL1 to the outer edge in the first direction DR1, a second distance D2 from the second align mark AL2 to the outer edge in the first direction DR1, a third distance D3 from the third align mark AL3 to the outer edge in the second direction DR2, and a fourth distance D4 from the fourth align mark AL4 to the outer edge in the second direction DR2 may be measured. The first distance D1, the second distance D2, the third distance D3, and the fourth distance D4 may be compared with a first reference distance, a second reference distance, a third reference distance, and a fourth reference distance.

Since the pre-light-blocking film layer 300 includes a light-blocking material, the dummy light-blocking film layer 310 may also include the light-blocking material. Accordingly, when the dummy light-blocking film layer 310 overlaps the align mark AL, the align mark AL may not be recognized. Accordingly, the pre-light-blocking film layer 300 may not overlap the align mark AL, and accordingly, the dummy light-blocking film layer 310 may not also overlap the align mark AL.

Although the embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
   a display panel comprising:
      a display area in which a plurality of pixels is disposed; and
      a bending area bent from the display area;
   a polarizing layer disposed on the display panel; and
   a light-blocking film layer disposed on a first surface the display panel,
   wherein an entirety of a first surface of the light-blocking film layer facing the display panel directly contacts an entirety of the first surface of the display panel in the display area, and an area of a second surface of the light-blocking film layer opposite to the first surface of the light-blocking film layer is smaller than an area of the first surface of the light-blocking film layer.

2. The display device of claim 1, wherein the light-blocking film layer comprises:
   a first adhesive layer directly contacting the first surface of the display panel in the display area; and
   a light-blocking material layer disposed on a first surface of the first adhesive layer opposite to the second surface of the first adhesive layer facing the display panel.

3. The display device of claim 1, wherein a second surface of the display panel opposite to the first surface of the display panel in the display area directly contacts a first surface of the polarizing layer facing the display panel.

4. The display device of claim 3, wherein an area of the first surface of the polarizing layer is identical to an area of the second surface of the display panel in the display area.

5. The display device of claim 3, wherein the polarizing layer comprises:
   a second adhesive layer directly contacting the second surface of the display panel; and
   a polarizing functional layer disposed on the second adhesive layer.

6. The display device of claim 1, wherein an area of a first surface of the polarizing layer facing the display panel is smaller than an area of a second surface of the polarizing layer opposite to the first surface of the polarizing layer.

7. The display device of claim 1, wherein an area of the first surface of the display panel is smaller than an area of a second surface of the display panel opposite to the first surface of the display panel.

8. A manufacturing method of a display device, the manufacturing method comprising: forming an align mark in a dummy area of a mother substrate comprising a display panel area comprising a first area in which a plurality of pixels is disposed and a second area adjacent to is the first area, and the dummy area adjacent to a side of the display panel area; disposing a pre-polarizing layer on the mother substrate to cover an entirety of a first surface of the mother substrate in the first area; disposing a pre-light-blocking film layer on a second surface the mother substrate opposite to the first surface of the mother substrate to cover an entirety of the second surface of the mother substrate in the first area; cutting the mother substrate, the pre-polarizing layer, and the pre-light-blocking film layer along a cutting line which is a boundary between the display panel area and the dummy area to form a display substrate including the plurality of pixels and a dummy substrate including the align mark; and inspecting a cutting defect by imaging the align mark.

9. The manufacturing method of claim 8, wherein the dummy substrate comprises: a dummy light-blocking film layer corresponding to a portion of the pre-light-blocking film layer overlapping the dummy area; a dummy panel corresponding to the dummy area of the mother substrate, including the align mark, and disposed on the dummy light-blocking film layer; and a dummy polarizing layer corresponding to a portion of the pre-polarizing layer overlapping the dummy area, and disposed on the dummy panel.

10. The manufacturing method of claim 9, wherein the align mark does not overlap the dummy light-blocking film layer in a plan view.

11. The manufacturing method of claim 8, wherein the display substrate comprising: a light-blocking film layer corresponding to a portion of the pre-light-blocking film layer overlapping the display panel area; a display panel corresponding to the display panel area of the mother substrate, including the plurality of pixels, and disposed on the light-blocking film layer; and a polarizing layer corresponding to a portion of the pre-polarizing layer overlapping the dummy area, and disposed on the display panel.

12. The manufacturing method of claim 11, wherein the display panel comprises: a display area corresponding to the first area, in which the plurality of pixels is disposed; and a bending area corresponding to the second area, and bent from the display area.

13. The manufacturing method of claim 12, wherein an entirety of a first surface of the light-blocking film layer facing the display panel directly contacts an entirety of a first surface of the display panel facing the light-blocking film layer in the display area.

14. The manufacturing method of claim 13, wherein an area of a second surface of the light-blocking film layer facing the first surface of the light-blocking film layer is smaller than an area of the first surface of the light-blocking film layer.

15. The manufacturing method of claim 12, wherein a first surface of the display panel facing the polarizing layer directly contacts a first surface of the polarizing layer facing the display panel in the display area.

16. The manufacturing method of claim 15, wherein an area of the first surface of the polarizing layer is identical to an area of the first surface of the display panel in the display area.

17. The manufacturing method of claim 15, wherein an area of the first surface of the polarizing layer is smaller than an area of a second surface of the polarizing layer opposite to the first surface of the polarizing layer.

18. The manufacturing method of claim 11, wherein an area of a first surface of the display panel facing the light-blocking film layer is smaller than an area of a second surface of the display panel opposite to the first surface of the display panel.

19. The manufacturing method of claim 8, wherein the mother substrate, the pre-polarizing layer, and the pre-light-blocking film layer are cut by intense light.

20. The manufacturing method of claim 19, wherein the intense light is incident on a first surface of the pre-polarizing layer facing the mother substrate.

* * * * *